US007655567B1

(12) United States Patent
Gao et al.

(10) Patent No.: US 7,655,567 B1
(45) Date of Patent: Feb. 2, 2010

(54) METHODS FOR IMPROVING UNIFORMITY AND RESISTIVITY OF THIN TUNGSTEN FILMS

(75) Inventors: Juwen Gao, Fremont, CA (US); Lana Hiului Chan, Santa Clara, CA (US); Panya Wongsenakhum, San Francisco, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 11/782,570

(22) Filed: Jul. 24, 2007

(51) Int. Cl.
*H01L 23/48* (2006.01)
*H01L 23/52* (2006.01)
*H01L 29/40* (2006.01)
*H01L 21/4763* (2006.01)
*H01L 21/44* (2006.01)

(52) U.S. Cl. .................. 438/685; 438/648; 438/656; 438/674; 438/677; 438/680; 257/750; 257/751; 257/761; 257/763; 257/768

(58) Field of Classification Search .................. 438/677, 438/902, 622–640, 656, 675, 672, 679–681, 438/685, 761; 257/E21.171, E21.58
See application file for complete search history.

(56) References Cited

U.S. PATENT DOCUMENTS

| 4,804,560 | A | 2/1989 | Shioya et al. |
|---|---|---|---|
| 5,028,565 | A | 7/1991 | Chang et al. |
| 5,227,329 | A | 7/1993 | Kobayashi et al. |
| 5,250,329 | A | 10/1993 | Miracky et al. |
| 5,326,723 | A | 7/1994 | Petro et al. |
| 5,391,394 | A | 2/1995 | Hansen |
| 5,661,080 | A | 8/1997 | Hwang et al. |
| 5,726,096 | A | 3/1998 | Jung |
| 5,795,824 | A | 8/1998 | Hancock |
| 5,804,249 | A | 9/1998 | Sukharev et al. |
| 5,817,576 | A | 10/1998 | Tseng et al. |

(Continued)

FOREIGN PATENT DOCUMENTS

WO       WO01/27347       4/2001

OTHER PUBLICATIONS

Lee et al., PCT Search Report, Completed Oct. 15, 2004, PCT/US2004/006940, Int'l filing date May 3, 2004.

(Continued)

*Primary Examiner*—David Vu
*Assistant Examiner*—Arman Khosraviani
(74) *Attorney, Agent, or Firm*—Weaver Austin Villeneuve & Sampson LLP

(57) ABSTRACT

The methods described herein relate to deposition of low resistivity, highly conformal tungsten nucleation layers. These layers serve as a seed layers for the deposition of a tungsten bulk layer. The methods are particularly useful for tungsten plug fill in which tungsten is deposited in high aspect ratio features. The methods involve depositing a nucleation layer by a combined PNL and CVD process. The substrate is first exposed to one or more cycles of sequential pulses of a reducing agent and a tungsten precursor in a PNL process. The nucleation layer is then completed by simultaneous exposure of the substrate to a reducing agent and tungsten precursor in a chemical vapor deposition process. In certain embodiments, the process is performed without the use of a borane as a reducing agent.

14 Claims, 3 Drawing Sheets

U.S. PATENT DOCUMENTS

| | | | |
|---|---|---|---|
| 5,956,609 | A | 9/1999 | Lee et al. |
| 6,001,729 | A | 12/1999 | Shinriki et al. |
| 6,017,818 | A | 1/2000 | Lu |
| 6,037,263 | A | 3/2000 | Chang |
| 6,066,366 | A | 5/2000 | Berenbaum et al. |
| 6,099,904 | A | 8/2000 | Mak et al. |
| 6,107,200 | A | 8/2000 | Takagi et al. |
| 6,143,082 | A | 11/2000 | McInerney et al. |
| 6,174,812 | B1 | 1/2001 | Hsiung et al. |
| 6,206,967 | B1 | 3/2001 | Mak et al. |
| 6,245,654 | B1 | 6/2001 | Shih et al. |
| 6,265,312 | B1 | 7/2001 | Sidhwa et al. |
| 6,277,744 | B1 | 8/2001 | Yuan et al. |
| 6,294,468 | B1 | 9/2001 | Gould-Choquette et al. |
| 6,297,152 | B1 | 10/2001 | Itoh et al. |
| 6,309,966 | B1 | 10/2001 | Govindarajan et al. |
| 6,355,558 | B1 | 3/2002 | Dixit et al. |
| 6,404,054 | B1 | 6/2002 | Oh et al. |
| 6,551,929 | B1 | 4/2003 | Kori et al. |
| 6,566,250 | B1 | 5/2003 | Tu et al. |
| 6,566,262 | B1 | 5/2003 | Rissman et al. |
| 6,607,976 | B2 | 8/2003 | Chen et al. |
| 6,635,965 | B1 | 10/2003 | Lee et al. |
| 6,706,625 | B1 | 3/2004 | Sudijono et al. |
| 6,720,261 | B1 | 4/2004 | Anderson et al. |
| 6,740,585 | B2 | 5/2004 | Yoon et al. |
| 6,797,340 | B2 | 9/2004 | Fang et al. |
| 6,844,258 | B1 | 1/2005 | Fair et al. |
| 6,861,356 | B2 | 3/2005 | Matsuse et al. |
| 6,902,763 | B1 | 6/2005 | Elers et al. |
| 6,936,538 | B2 | 8/2005 | Byun |
| 6,962,873 | B1 | 11/2005 | Park |
| 7,005,372 | B2 * | 2/2006 | Levy et al. .................. 438/627 |
| 7,141,494 | B2 | 11/2006 | Lee et al. |
| 7,262,125 | B2 | 8/2007 | Wongsenakhum et al. |
| 7,429,402 | B2 | 9/2008 | Gandikota et al. |
| 2001/0008808 | A1 | 7/2001 | Gonzalez |
| 2001/0014533 | A1 | 8/2001 | Sun |
| 2001/0015494 | A1 | 8/2001 | Ahn |
| 2001/0044041 | A1 | 11/2001 | Badding et al. |
| 2002/0090796 | A1 | 7/2002 | Desai et al. |
| 2002/0177316 | A1 | 11/2002 | Miller et al. |
| 2003/0059980 | A1 | 3/2003 | Chen et al. |
| 2003/0104126 | A1 | 6/2003 | Fang et al. |
| 2003/0127043 | A1 | 7/2003 | Lu et al. |
| 2004/0044127 | A1 | 3/2004 | Okubo et al. |
| 2004/0206267 | A1 | 10/2004 | Sambasivan et al. |
| 2005/0136594 | A1 | 6/2005 | Kim |
| 2006/0094238 | A1 | 5/2006 | Levy et al. |

OTHER PUBLICATIONS

Lee et al., Written Opinion, Completed Oct. 15, 2004, PCT/US2004/006940, Int'l filing date May 3, 2004.

George et al., "Surface Chemistry for atomic Layer Growth", J. Phys. Chem, 1996, vol. 100, No, 31, pp. 13121-13131.

Bell et al., "Batch Reactor Kinetic Studies of Tungsten LPCVD from Silane and Tungsten Hexafluoride", J. Electrochem. Soc., Jan. 1996, vol. 143, No. 1, pp. 296-302.

Klaus et al., "Atomic layer deposition of tungsten using sequential surface chemistry with a sacrificial stripping reaction", Thin Solid Films 360 (2000) 145-153.

Klaus et al., "Atomically Controlled Growth of Tungsten and Tungsten Nitride Using Sequential Surface Reactions," Applied Surface Science, 162-163, (2000) 479-491.

Li et al., "Deposition of $WN_xC_y$ Thin Films by ALCVD™ Method for Diffusion Barriers in Metallization," IITC Conference Report, 2002, 3 Pages.

Elam et al, "Nucleation and Growth During Tungsten Atomic Layer Deposition on $SiO_2$ Surfaces," Thin Solid Films, 2001, 13 Pages.

Collins et al., "Pulsed Deposition of Ultra Thin Tungsten for Plugfill of High Aspect Ratio Contacts," Presentation made at Semicon Korea 2003, Jan. 21, 2003, 9 pages.

Collins, et al., "Pulsed Deposition of Ultra Thin Tungsten for Plugfill of High Aspect Ratio Contacts," Semiconductor Equipment and Materials International, Semicon Korea, Jan. 21, 2003, 3 pages.

Lee et al., Pulsed Deposition of Ultra Thin Tungsten and its Application for Plugfill of High Aspect Ratio Contacts, Abstract, Jan. 21, 2003, 1 page.

U.S. Office Action mailed Jul. 12, 2005, from U.S. Appl. No. 10/815,560.

U.S. Office Action mailed Jul. 17, 2002, from U.S. Appl. No. 09/975,074.

U.S. Office Action mailed Feb. 8, 2005, from U.S. Appl. No. 10/649,351.

U.S. Office Action mailed Jul. 14, 2005, from U.S. Appl. No. 10/649,351.

Presentation by Inventor James Fair: "Chemical Vapor Deposition of Refractory Metal Silicides," 27 Pages, 1983.

Saito et al., "A Novel Copper Interconnection Technology Using Self Aligned Metal Capping Method," IEEE, 3 Pages, 2001.

U.S. Office Action mailed Jun. 22, 2004, from U.S. Appl. No. 10/435,010.

U.S. Office Action mailed Mar. 23, 2005, from U.S. Appl. No. 10/690,492.

U.S. Office Action mailed Nov. 23, 2005, from U.S. Appl. No. 10/984,126.

Chan et al., "Methods for Growing Low-Resistivity Tungsten Film", Novellus Systems, Inc., filed Nov. 1, 2005, U.S. Appl. No. 11/265,531, pp. 1-35.

Levy et al., "Deposition of Tungsten Nitride", Novellus Systems, Inc., filed Dec. 16, 2005, U.S. Appl. No. 11/305,368, pp. 1-39.

U.S. Office Action mailed Dec. 28, 2005, from U.S. Appl. No. 10/815,560.

U.S. Office Action mailed Dec. 30, 2005, from U.S. Appl. No. 10/649,351.

Wongsenakhum et al., "Reducing Silicon Attack and Improving Resistivity of Tungsten Nitride Film", Novellus Systems, Inc., filed Feb. 6, 2006, U.S. Appl. No. 11/349,035, pp. 1-26.

U.S. Office Action mailed Apr. 17, 2006, from U.S. Appl. No. 10/815,560.

U.S. Office Action mailed May 17, 2006, from U.S. Appl. No. 10/984,126.

U.S. Office Action mailed Sep. 28, 2006, from U.S. Appl. No. 10/815,560.

Chan et al., "Methods for Growing Low-Resistivity Tungsten for High Aspect Ratio and Small Features," Novellus Systems, Inc., U.S. Appl. No. 12/030,645, filed Feb. 13, 2008.

Humayun et al., "Methods for Forming All Tungsten Contacts and Lines," Novellus Systems, Inc., U.S. Appl. No. 11/963,698, filed Dec. 21, 2007.

Chan et al., "Method for Improving Uniformity and Adhesion of Low Resistivity Tungsten Film," Novellus Systems, Inc., U.S. Appl. No. 11/951,236, filed Dec. 5, 2007.

Notice of Allowance and Fee Due mailed Mar. 12, 2003, from U.S. Appl. No. 09/975,074.

Allowed Claims from U.S. Appl. No. 09/975,074.

Notice of Allowance and Fee Due mailed Jul. 21, 2006, from U.S. Appl. No. 10/649,351.

Allowed Claims from U.S. Appl. No. 10/649,351.

Notice of Allowance and Fee Due mailed Oct. 7, 2004, from U.S. Appl. No. 10/435,010 .

Allowed Claims from U.S. Appl. No. 10/435,010.

Notice of Allowance and Fee Due mailed Aug. 25, 2006, from U.S. Appl. No. 10/984,126.

Notice of Allowance and Fee Due mailed Sep. 14, 2005, from U.S. Appl. No. 10/690,492.

Allowed Claims from U.S. Appl. No. 10/690,492.

Notice of Allowance and Fee Due mailed Apr. 24, 2007, from U.S. Appl. No. 10/815,560.

Allowed Claims from U.S. Appl. No. 10/815,560.

U.S. Office Action mailed Jun. 27, 2008, from U.S. Appl. No. 11/305,368.

U.S. Office Action mailed Aug. 21, 2008, from U.S. Appl. No. 11/265,531.

Ashtiani et al., "Ternary Tungsten-Containing Thin Film Heater Elements," Novellus Systems, Inc., U.S. Appl. No. 61/025,237, filed Jan. 31, 2008.

Chen et al., "Method for Reducing Tungsten Roughness and Improving Reflectivity," Novellus Systems, Inc., U.S. Appl. No. 12/202,126, filed Aug. 29, 2008.

U.S. Office Action mailed Oct. 16, 2008, from U.S. Appl. No. 11/349,035.

Ashtiani et al., "Ternary Tungsten-Containing Thin Films," Novellus Systems, Inc., U.S. Appl. No. 12/363,330, filed Jan. 30, 2009.

Chandrashekar et al., "Method for depositing thin tungsten film with low resistivity and robust micro-adhesion characteristics," Novellus Systems, Inc., U.S. Appl. No. 61/061,078, filed Jun. 12, 2008.

U.S. Office Action mailed Apr. 3, 2009, from U.S. Appl. No. 11/305,368.

U.S. Final Office Action mailed Feb. 26, 2009, from U.S. Appl. No. 11/265,531.

U.S. Notice of Allowance mailed May 4, 2009 from U.S. Appl. No. 11/265,531.

Allowed Claims from U.S. Appl. No. 11/265,531.

U.S. Final Office Action mail Feb. 25, 2009, from U.S. Appl. No. 11/349,035.

U.S. Office Action mailed Jun. 11, 2009, from U.S. Appl. No. 11/963,698.

U.S. Office Action mailed Jun. 4, 2009, from U.S. Appl. No. 11/349,035.

U.S. Office Action mailed Jun. 24, 2009, from U.S. Appl. No. 12/030,645.

Ken K. Lai and H. Henry Lamb, "Precursors for Organometallic Chemical Vapor Deposition of Tungsten Carbide Films," 1995, Chemistry Material, pp. 2284-2292.

* cited by examiner

METHODS FOR IMPROVING UNIFORMITY AND RESISTIVITY OF THIN TUNGSTEN FILMS

FIELD OF INVENTION

This invention relates to methods for preparing tungsten films. The invention is particularly useful for integrated circuit applications that require conformal thin tungsten films having low electrical resistance.

BACKGROUND

The deposition of tungsten films using chemical vapor deposition (CVD) techniques is an integral part of many semiconductor fabrication processes. The tungsten films may be used to produce low resistivity electrical connections in the form of horizontal interconnects, vias between adjacent metal layers, and contacts between a first metal layer and the devices on the silicon substrate. In a conventional tungsten deposition process, the wafer is heated to the process temperature in a vacuum chamber, and then a very thin portion of tungsten film, which serves as a seed or nucleation layer, is deposited. Thereafter, the remainder of the tungsten film (the bulk layer) is deposited on the nucleation layer. Conventionally, the bulk layer is formed by the reduction of tungsten hexafluoride ($WF_6$) with hydrogen ($H_2$) on the growing tungsten layer. The bulk layer is generally deposited more rapidly than the nucleation layer, but cannot be produced easily and reliably without first forming the nucleation layer.

CVD and other deposition methods can be used to form a thin tungsten nucleation layer. In a CVD technique, the $WF_6$ and reducing gas (e.g., $SiH_4$ and/or $H_2$) are simultaneously introduced into the reaction chamber. This produces a continuous chemical reaction of mixed reactant gases that continuously forms tungsten film on the substrate surface. In a typical example, CVD nucleation layers are deposited from $WF_6$—SiH4 with an argon carrier gas. Other deposition methods such as atomic layer deposition (ALD) and pulsed nucleation layer (PNL) techniques may also be used to form nucleation layers.

Advancing technology requires that tungsten electrical connects be increasingly thin yet maintain very low resistance. Hence, it is critical that tungsten deposition process provide tungsten having very low resistivity. CVD-deposited bulk tungsten makes up most of the film, but how the CVD film grows depends on the nucleation film. Although CVD and other methods have been able to deposit nucleation layers, their ability to provide nucleation layers for the deposition of low resistivity tungsten in smaller features with high aspect ratios is limited. What are therefore needed are improved methods for forming a conformal nucleation layer that will lead to low resistivity tungsten films with good step coverage for small features.

SUMMARY OF INVENTION

The methods described herein relate to deposition of low resistivity, highly conformal tungsten nucleation layers. These layers serve as a seed layers for the deposition of a tungsten bulk layer. The methods are particularly useful for tungsten plug fill in which tungsten is deposited in high aspect ratio features. The methods involve depositing a nucleation layer by a combined PNL and CVD process. The substrate is first exposed to one or more cycles of sequential pulses of a reducing agent and a tungsten precursor in a PNL process. The nucleation layer is then completed by simultaneous exposure of the substrate to a reducing agent and tungsten precursor in a chemical vapor deposition process. In certain embodiments, the process is performed without the use of a borane as a reducing agent.

BRIEF DESCRIPTION OF THE DRAWINGS

The following detailed description can be more fully understood when considered in conjunction with the drawings in which.

DETAILED DESCRIPTION

Introduction

Figure 1:
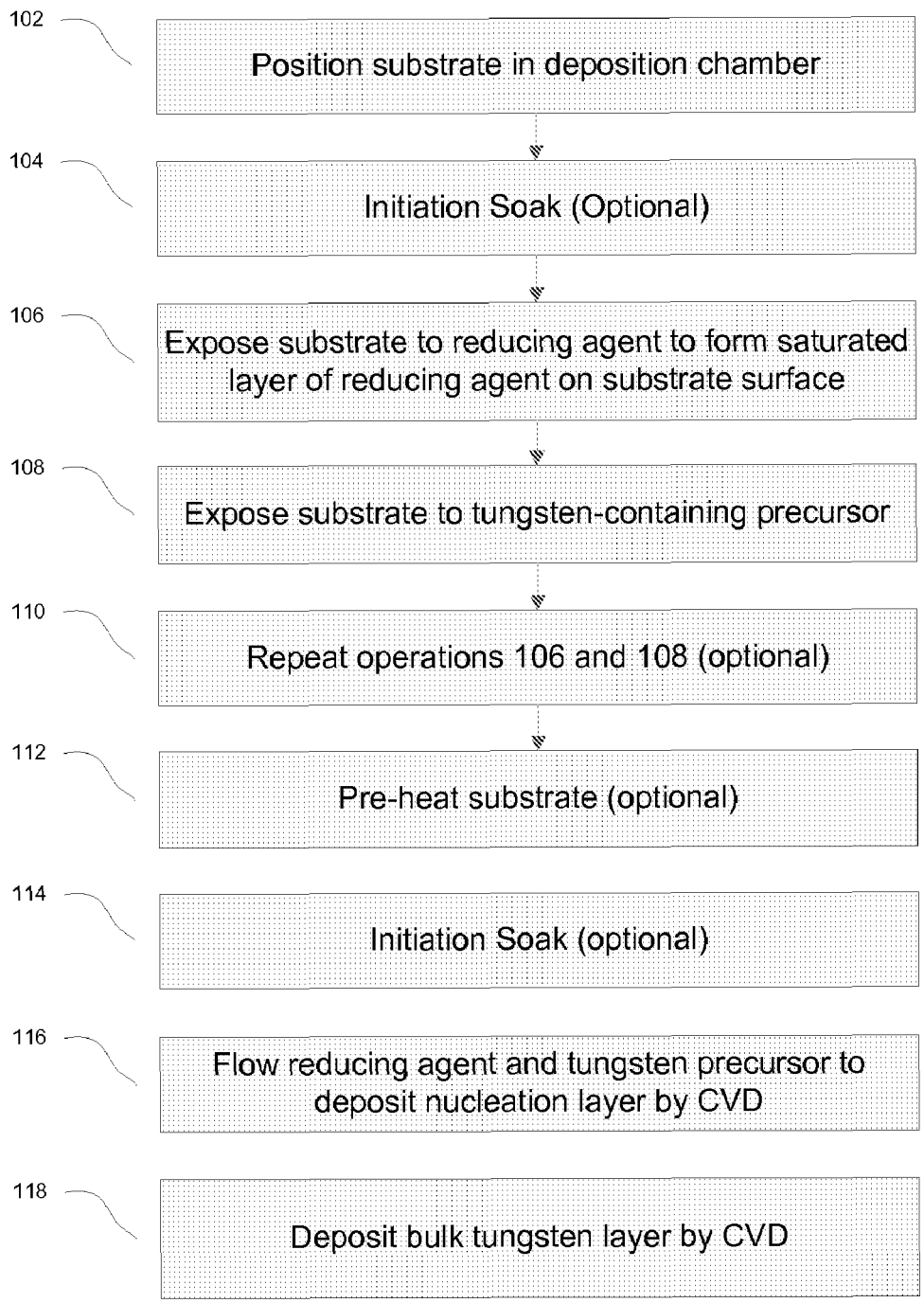
FIGS. 1 and 2 are show process flows showing relevant operations of methods for depositing tungsten layers according to various embodiments.

In the following description, numerous specific details are set forth in order to provide a thorough understanding of the present invention, which pertains to forming thin tungsten films. The methods involve pulsed nucleation layer (PNL) deposition techniques, which will be described in detail below. Modifications, adaptations or variations of specific methods and or structures shown and discussed herein will be apparent to those skilled in the art and are within the scope of this invention.

The present invention involves forming a tungsten film by way of a tungsten nucleation layer. In general, a nucleation layer is a thin conformal layer which serves to facilitate the subsequent formation of a bulk material thereon. Conformation to the underlying feature is critical to support high quality deposition. While efficient tungsten deposition processes require tungsten nucleation layers, these layers typically have higher electrical resistivities than the bulk tungsten layers. To keep the electrical resistance of the overall tungsten film (tungsten nucleation layer and bulk tungsten) low, the tungsten nucleation layer should be kept as thin as possible—though sufficiently thick to fully cover the underlying substrate to support high quality bulk deposition.

Forming a nucleation layer using one or more PNL cycles is discussed in U.S. Pat. Nos. 6,844,258; 7,141,494; and 7,005,372 and U.S. patent application Ser. No. 11/265,531, which are incorporated by reference for all purposes. These PNL nucleation layer processes involve exposing a substrate to various sequences of reducing agents and tungsten precursors to grow a nucleation layer of the desired thickness. In a PNL technique, pulses of the reducing agent, purge gases, and tungsten-containing precursors are sequentially injected into and purged from the reaction chamber. The process is repeated in a cyclical fashion until the desired thickness is achieved. PNL is similar to atomic layer deposition techniques reported in the literature. PNL is generally distinguished from atomic layer deposition (ALD) by its higher operating pressure range (greater than 1 Torr) and its higher growth rate per cycle (greater than 1 monolayer film growth per cycle). In the context of this invention, PNL broadly embodies any cyclical process of sequentially adding reactants for reaction on a semiconductor substrate. Thus, the concept embodies techniques conventionally referred to as ALD.

The methods described herein use a combined PNL and CVD approach to form the nucleation layer. It has been found that the combined approach results in the high quality conformal nucleation layers (unlike CVD-only methods) while providing films having lower resistivity than nucleation layers formed using the same chemistry in PNL-only methods. The nucleation layer deposition methods typically involve first a small number of PNL cycles, e.g., 1-6. This PNL operation may or may not result in a measurable amount of tungsten deposited on the substrate. The methods then involve using a CVD process to deposit the rest of the nucleation layer. A bulk layer is then deposited, typically by a CVD process. The resulting film has the good conformality and uniformity associated with PNL-nucleation layers, while having improved resistivity.

In certain embodiments, the tungsten deposition processes are performed without any use of boron-containing compounds. Boron may not be desirable in certain applications, e.g., because it may degrade device performance. That the processes may be performed without the use of boron is significant because methods of producing tungsten films without boron previously were not able to obtain the low resistivities achieved with the combined PNL-CVD methods.

Process

FIG. 1 is a process flow sheet showing important operations in the methods according to various embodiments. Initially, a substrate is provided and positioned in a reaction chamber as indicated by a process block 102. As mentioned previously, in many embodiments the substrate is a partially fabricated electronic device (e.g., a partially fabricated integrated circuit). Some specific applications of the invention will be described later. Prior to the pulsed nucleation process, the semiconductor substrate, optionally, is exposed to a gas, which promotes growth of tungsten with no nucleation delay. This step, which is called an "initiation soak" step is indicated at a process block 104 and involves exposure of the substrate to a gas such as $SiH_4$, $B_2H_6$, $Si_2H_6$, $H_2$, Ar, $N_2$, or $O_2$, or a combination thereof, in a gaseous or plasma state for about 1 to about 60 seconds. If used, the plasma state can be produced using a radio frequency or microwave energy source. This serves to precondition the substrate surface. As explained elsewhere herein, an example of a soak step is a single $SiH_4$ pulse (e.g., in an Ar or Ar—$H_2$ carrier gas) or a single $B_2H_6$ pulse prior to $WF_6$—$SiH_4$ PNL. This establishes a layer of reducing agent on the wafer surface, which can reduce or eliminate nucleation delays by providing an optimal surface for tungsten nucleation more or less regardless of the condition of the adhesion layer applied during prior processing of the wafer (typically a Ti—TiN layer). In certain embodiments, in the absence of a soak step, a process may use an extra-long initial $SiH_4$ (or other reducing agent) dose, which would function just like a soak step. Note that the soak can be viewed as an initial cycle. As such, it should be noted that the invention contemplates processes in which dose times are modified as a function of cycle number. In a specific example, a long initial $SiH_4$ or $B_2H6$ dose is employed to improve nucleation density (number of nuclei per unit area) and to reduce nucleation delay.

Next, as indicated by a process block 106, the substrate is exposed to a reducing agent. In certain embodiments, this is a non-boron-containing reducing agent, e.g., silane. Silane and related compounds have been found to adsorb well to metal nitride surfaces such as titanium nitride and tungsten nitride used as barrier layer materials in some integrated circuit applications. Any suitable silane or silane derivative may be used, including organic derivative of silanes. In particular embodiments, the silane is $SiH_4$. Silanes adsorb on the substrate surface in a self-limiting manner so as to create nominally a monolayer of silane species. Thus, the amount of adsorbed species is largely independent of the silane dosage.

Other reducing agents may be used in the PNL process, including diborane. If an initiation soak step is performed, the initiation soak step may use the same reducing agent as the subsequent PNL process, or a different one (e.g., $SiH_4$ soak and $B_2H_6$/$WF_6$ PNL or $B_2H_6$ soak and $SiH_4$/$WF_6$ PNL).

In the PNL process, once the substrate is sufficiently covered with reducing agent species, the flow of reducing agent to the reaction chamber is stopped and the reaction chamber is purged with a carrier gas such as argon, hydrogen, nitrogen or helium. The gas purge clears the regions near the substrate surface of residual gas reactants that could react with fresh gas reactants for the next reaction step.

Referring back to FIG. 1, the next operation 108 involves contacting the substrate with a tungsten precursor. Any suitable tungsten-containing precursor may be used. In preferred embodiments the tungsten precursor is one of $WF_6$, $WCl_6$ and $W(CO)_6$. The tungsten precursor is typically provided in a dilution gas, such as argon, nitrogen, hydrogen, or a combination thereof. Tungsten precursor dosage and substrate exposure time will vary depending upon a number of factors. Typical exposure times range from 0.2-2 seconds.

The tungsten precursor flow is then stopped and the reaction chamber is purged with a carrier gas. The reducing agent and tungsten precursor operations are optionally repeated in as indicated in a process block 110. In previous PNL nucleation deposition processes, the tungsten precursor is flowed in an amount sufficient to react with the adsorbed layer of reducing agent, forming a layer of tungsten. The PNL cycles are repeated until the desired thickness is deposited (e.g., 25-100 Angstroms).

According to various embodiments of processes described herein, the number of PNL cycles ranges from about one to six, and is two in certain embodiments. The initial cycles may not produce a significant or measurable amount of tungsten. This is due to nucleation delay—once the delay is overcome, each PNL cycle deposits between about 5 to 15 Angstroms. According to various embodiments, the initial cycle or cycles may deposit a very thin film of tungsten (e.g., on the order of 1-5 Angstroms) or the may function as surface preparation only without depositing tungsten. It has been found that the depositing more than about 5 Angstroms via PNL increases the resistivity of the resulting film (nucleation+bulk layers). Thus, in certain embodiments, operations 106-110 are performed to deposit between about 0-5 Angstroms. This is accomplished by using a small number of cycles. In other embodiments, depending on the resistivity requirements, more film may be deposited in the PNL operation, e.g., about 5-10 Angstroms.

In the methods described herein, each of multiple PNL cycles generally use the same reactants, though in some embodiments, reactants may be changed in successive cycles. It should also be noted that in certain embodiments, the order of the reducing agent and tungsten precursor pulses in each cycle may be tungsten-containing precursor and then reducing agent. During the PNL process, substrate temperature is typically below about 350 C, for example between about 250 and 350 C or 275 and 350 C. In a specific embodiment, it is about 325 C. As is discussed in U.S. application Ser. No. 11/265,531, incorporated by reference above, PNL temperatures in this range may result in improved step coverage and thickness control. Pressure may range broadly, for example, from about 1-100 Torr. In certain embodiments, pressure is between about 20-60 Torr, e.g., 40 Torr. Also, it should be noted that the reducing agent and tungsten precursor pulses may be performed in the same station, different stations of a multi-station chamber, or in different chambers.

After the PNL cycles are performed, the tungsten nucleation layer is completed by a CVD process. There may be a pre-heat operation in embodiments in which the CVD temperature is higher than the PNL temperature. See block 112. Also, between the PNL and CVD operations of depositing the nucleation layer, an optional soak operation may be performed, as described above. See block 114.

The rest of the nucleation layer is then deposited by a CVD process as indicated in block 116. The PNL and CVD operations may be performed in a single station, different stations of a multi-station chamber, or in different chambers. Unlike the PNL process of operations 108 and 110, the substrate is simultaneously exposed to the reducing agent and the tungsten precursor to deposit a tungsten film by CVD. Any suitable CVD process may be used with any suitable tungsten-containing precursor. In some embodiments the same tungsten-containing precursor used in the PNL processes for forming the tungsten nucleation layer is use—typically one of $WF_6$, $WCl_6$ and $W(CO)_6$. Conventional tungsten CVD processes for depositing a bulk layer are performed using a mixture of molecular hydrogen and one or more of these precursors, e.g., $H_2$—$WF_6$ reduction. However, for depositing a nucleation layer, it has been found that to obtain low resistivity, a silane or borane reducing agent is optimal. In particular, a silane reducing agent is used for applications in which boron is not desirable. In some instances, CVD nucleation performance is enhanced by the presence of $H_2$ in carrier gas mixture. (The $WF_6$—$SiH_4$ reaction is much faster than the $WF_6$-$H_2$ reaction due to lower activation energy and greater reactivity.) Hydrogen may flow in the background, so the CVD reactants in certain embodiments, the reactants are a tungsten precursor together with silane or a mixture of hydrogen and silane. In other embodiments a tungsten precursor together with a borane or a mixture of hydrogen and borane are used. Pressure is typically between 1-100 Torr, e.g., around 40 Torr. Temperature of the CVD operation is typically higher than that of the PNL operation, ranging from 375-445 C, e.g., at about 415 C.

Operation 116 is performed until the desired thickness of tungsten is deposited for the nucleation layer. The total nucleation layer thickness is typically about 10-100 Angstroms, e.g., 20 Angstroms.

Returning to FIG. 1, after the nucleation layer is deposited, a CVD bulk layer is deposited. The bulk tungsten can be deposited to any thickness. Tungsten interconnect lines for integrated circuit applications may have a total thickness (tungsten nucleation layer and bulk tungsten) of between about 200 and 1,000 Angstroms. For a typical bit line, the total tungsten film thickness is typically no greater than about 500 Angstroms. (For thick films, operations 104-118 may be repeated. This is because the bulk layer will have reduced roughness because it is formed on the "smooth" nucleation layer. But after some amount of deposition, the bulk layer grains will grow relatively large and increase the roughness of the tungsten film. To prevent this, the bulk layer growth may be terminated after the tungsten deposited by this process grows to a certain thickness, e.g., 500 angstroms. Another nucleation layer may then be deposited as a seed for the next bulk deposition).

Figure 2:
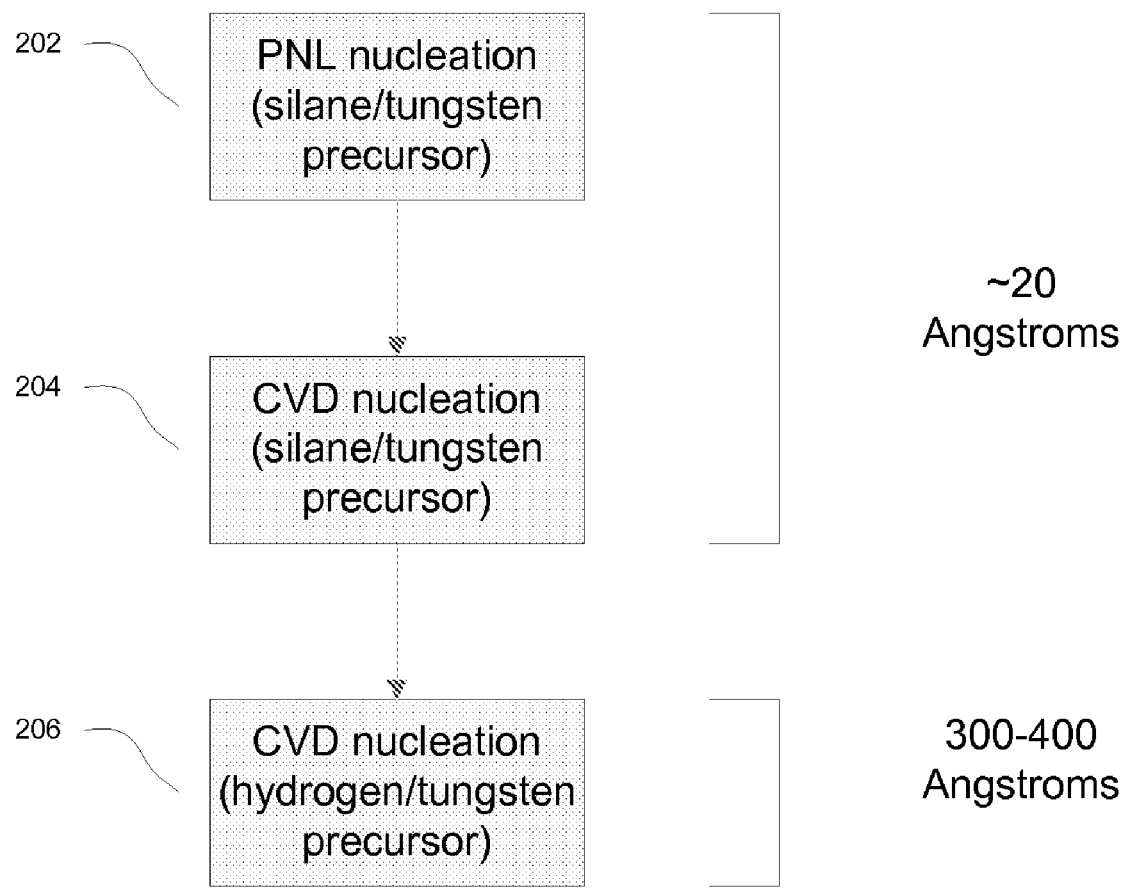

FIG. 2 provides an overview of the process described above. The PNL nucleation process is indicated by process block 202. This corresponds to process blocks 104-110 in FIG. 1. The reducing agent is silane, though as mentioned above a borane may be used in certain embodiments. The CVD nucleation process is then shown in process block 204. This corresponds to process blocks 112-116 in FIG. 1. Again, a borane may be used in place of a silane. In a particular embodiments, the nucleation layer is about 30-100 Angstroms. In some embodiments, the nucleation layer is thinner, e.g., about 20 Angstroms. It should be noted that while the nucleation layer can be thicker, nucleation layers around 20 Angstroms are sufficiently thick to support high quality bulk deposition. (In general, PNL-only layers can be thinner (down to about 10 Angstroms), however they do not have the low resistivity that PNL+CVD nucleation layers do. The CVD bulk layer is then deposited, as indicated in process block 206, typically by a hydrogen reduction process. In the figure the bulk layer is deposited to about 300-400 Angstroms, e.g., the bulk layer is about 350 Angstroms, though as indicated above, the bulk layer can be deposited to any thickness. It should be noted that in certain embodiments, operations 204 and 206 may be combined so long as silane is used—i.e., the low resistivity films are not obtained by omitting operation 204. Because operation 204 is often run with hydrogen in the background, in certain embodiments, the transition from CVD nucleation process to CVD bulk involves turning off silane flow, and maintaining a hydrogen and tungsten precursor flow. Also as indicated, in certain embodiments, the transition may involve maintaining all three flows—silane, hydrogen and tungsten precursor.

In variations of all of the above processes, a partial or complete tungsten nucleation layer is treated with a plasma after one of the dose operations, e.g., after dosing with a tungsten precursor. In one example, the plasma is generated from hydrogen, helium, nitrogen, argon, or a mixture of two or more of these components. The purge operation typically follows the plasma treatment. A plasma treatment may help to drive impurity out of the film (e.g., silicon or fluorine) that could reduce resistivity.

In some cases, a purpose of the plasma treatment is to introduce carbon, nitrogen or a specified dopant atom into the tungsten nucleation layer. In such situations, a nitrided or carbided tungsten nucleation layer can result. A nitrided nucleation layer can provide improved barrier properties. Carbon can be provided from various sources including, for example, carbon tetrafluoride and hexafluoroethane. The presence of carbon in the nucleation layer can further reduce resistivity of the tungsten film. In this process, various plasma conditions can be employed. In one example, the plasma is generated from a single radio frequency source (e.g., 13.56 MHz applied to a showerhead or pedestal in the deposition reactor). In another example, a multiple source system is employed; e.g., a 13.56 MHz source provides power to the showerhead and a 450 kHz source provides power to the pedestal, or vice-versa. Typically, the applied frequency range will be between about 450 kHz and 100 MHz.

Resistivity and Uniformity

The above-described methods provide tungsten films having improved resistivity and uniformity. Resistivity is dependent on the total thickness of the film (nucleation+bulk layers) with resistivity increasing with increasing thickness. A ~350 Angstrom film deposited using a PNL only nucleation process ($SiH_4$/$WF_6$)+CVD bulk layer results in >24 $\mu\Omega$-cm, with a electrical sheet resistance non-uniformity of <5%. Standard deviation of multiple points of sheet resistance measurement on a wafer is an indication of uniform coverage and conformality of the film, with higher uniformity (lower non-uniformity) indicating better coverage. If a CVD-only process is used (for nucleation and bulk deposition), a resistivity of <20 $\mu\Omega$-cm can be achieved but with a non-uniformity of >10%.

(It should be noted that improved resistivity and uniformity is possible with PNL-only processes that use borane). For certain applications, e.g., a metal gate, both low resistivity (less than about 20 μΩ-cm) and low non-uniformity (less than about 5%) are needed. The combined PNL-CVD nucleation layer methods described herein achieve this as shown in data presented below. The low resistivity and good uniformity of thin tungsten films unable to be achieved with existing CVD or PNL nucleation processes used alone.

EXAMPLES

A 350 Angstrom tungsten film was deposited using the sequence given in the following table:

| Layer | Process | Pressure, Temp, Time |
|---|---|---|
| Nucleation | 2 PNL Cycles ($SiH_4/WF_6$) | 40 Torr, 325 C. |
| | CVD ($SiH_4/WF_6$) | 40 Torr, 415 C., 2 seconds |
| Bulk | CVD ($H_2/WF_6$) | 40 Torr, 415 C., 11 seconds |

The resulting film had a non-uniformity of 2.5% and a resistivity of 19 tΩ-cm. This is an improvement over both the CVD-only and PNL-only processes as discussed above.

As indicated above, the PNL portion of the nucleation process does not result in measurable deposition in certain embodiments. This is shown in the below data on the PNL portion:

| Number of PNL cycles ($SiH_4/WF_6$) | Temperature | Thickness |
|---|---|---|
| 2 | 325 C. | <1 Angstroms (not measurable) |
| 4 | 325 C. | 14 Angstroms |
| 6 | 325 C. | 36 Angstroms |

Although 2 PNL cycles did not result in measurable deposition, it enhances the CVD tungsten nucleation and growth. This is shown in the table below:

| Process | Thickness (Angstroms) | % Non-uniformity (sheet metal resistance) | Resistivity (μΩ-cm) |
|---|---|---|---|
| CVD 2s nucleation + CVD bulk | 376 | 15.01 | 18.9 |
| CVD 4s nucleation + CVD bulk | 369 | 19.3 | 19.7 |
| (2 cycle PNL + CVD) nucleation + CVD bulk | 355 | 2.5 | 19.1 |
| (4 cycle PNL + CVD) nucleation + CVD bulk | 351 | 5.1 | 26.7 |
| (6 cycle PNL + CVD) nucleation + CVD bulk | 367 | 1.7 | 25.6 |

As can be seen, although the 2 cycle PNL process does deposit a measurable amount of tungsten, it still enhances CVD tungsten nucleation and growth. Specifically, 2 cycles of tungsten reduce non-uniformity from 19.3% to 2.5%.

Apparatus

The methods of the invention may be carried out in various types of deposition apparatus available from various vendors. Examples of suitable apparatus include a Novellus Concept-1 Altus, a Concept 2 Altus, a Concept-2 ALTUS-S, a Concept 3 Altus deposition system, or any of a variety of other commercially available CVD tools. In some cases, the process can be performed on multiple deposition stations sequentially. See, e.g., U.S. Pat. No. 6,143,082, which is incorporated herein by reference for all purposes. In some embodiments, the pulsed nucleation process is performed at a first station that is one of two, five or even more deposition stations positioned within a single deposition chamber. Thus, the reducing gases and the tungsten-containing gases are alternately introduced to the surface of the semiconductor substrate, at the first station, using an individual gas supply system that creates a localized atmosphere at the substrate surface.

In one example, after a first thickness of tungsten deposited, the wafer is moved to a second deposition station and a new wafer is moved into place on the first station. The wafers may be indexed from one deposition station to the next to enable parallel wafer processing after one or more repetitions of the cycle. The full thickness of the tungsten film is achieved by additional cycles with alternating reducing gases and tungsten-containing gases at one or more of the other deposition stations. This is repeated until all substrates are coated to the desired thickness. It is the sum of these individual depositions that forms the total amount of tungsten nucleation layer deposited. Any number of deposition stations, each capable of having a localized atmosphere isolated from adjacent stations, is possible within the single chamber.

The invention also provides for a deposition chamber in which alternating deposition stations are dedicated to deliver either tungsten-containing gases or reducing gases. More specifically, the deposition stations in the chamber are separated into two groups with the first group dedicated to delivery of the reducing gases and the second group for introducing tungsten-containing gas. These stations also can provide for the simultaneous delivery of carrier gases and/or hydrogen with the dedicated gases. Thus, tungsten is deposited by moving wafers from station to station such that the wafer is sequentially exposed to the reducing gases and then the tungsten-containing gases until the desired thickness of tungsten is obtained.

Applications

The present invention may be used to deposit thin, low resistivity tungsten layers for many different applications. One preferred application is for interconnects in integrated circuits such as memory chips and microprocessors. Interconnects are current lines found on a single metallization layer and are generally long thin flat structures. These may be formed by a blanket deposition of a tungsten layer (by a process as described above), followed by a patterning operation that defines the location of current carrying tungsten lines and removal of the tungsten from regions outside the tungsten lines.

A primary example of an interconnect application is a bit line in a memory chip. Of course, the invention is not limited to interconnect applications and extends to vias, contacts and other tungsten structures commonly found in electronic devices. In general, the invention finds application in any environment where thin, low-resistivity tungsten layers are required.

The invention is also focuses on low resistivity, tungsten layers having relatively thin proportions, typically on the order of 500 angstroms or less, preferably, 300 angstroms or less. But more generally, the invention applies to a broader range of tungsten layers, including those with thicknesses of between about 5 angstroms to 1000 angstroms.

Another parameter of interest for many applications is a relatively low roughness of the ultimately deposited tungsten layer. Preferably, the roughness of the tungsten layer is not greater than about 10% of the total thickness of the deposited tungsten layer, and more preferably not greater than about 5% of the total thickness of the deposited tungsten layer. The roughness of a tungsten layer can be measured by various techniques such as atomic force microscopy.

Figure 3A:
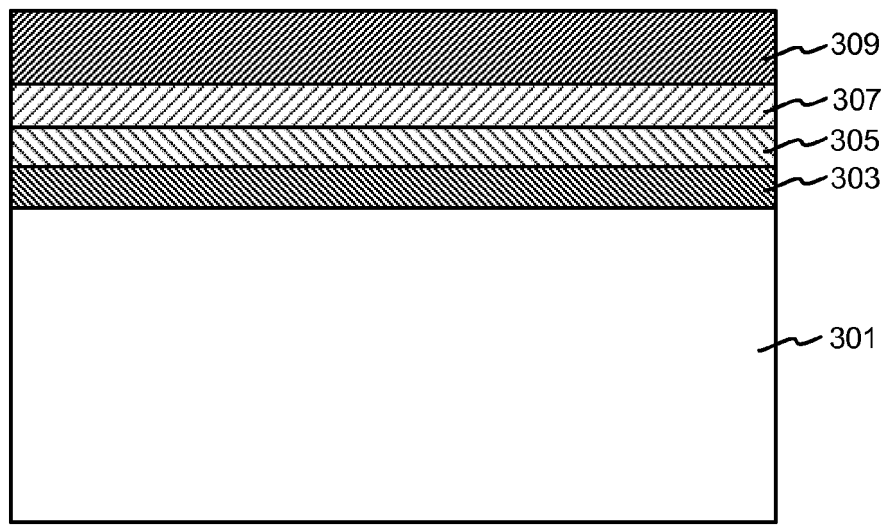
FIG. 3A is a film stack including a titanium adhesion layer together with a tungsten nucleation layer and a tungsten bulk layer formed in accordance with this invention.
Figure 3B:
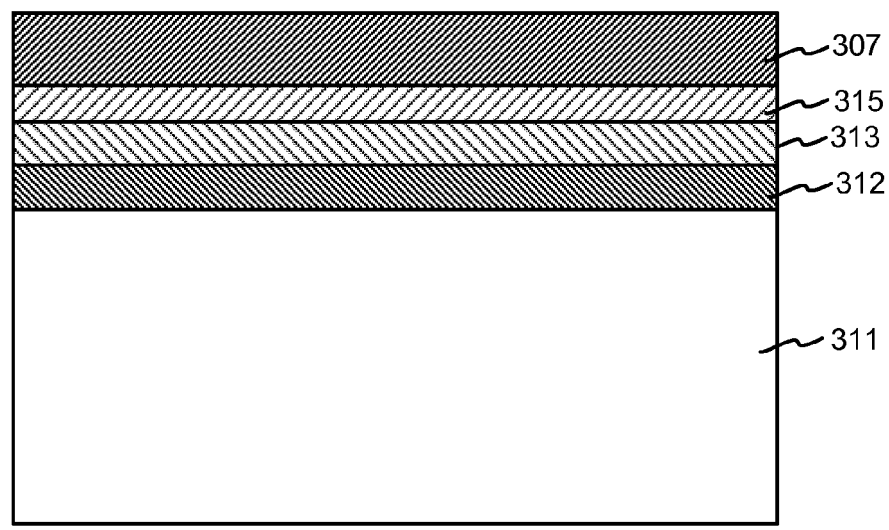
FIG. 3B is a film stack including a tungsten adhesion layer together with a tungsten nucleation layer and a tungsten bulk layer formed in accordance with this invention.

FIGS. 3A and 3B are cross-section illustrations of two different film stacks that can be formed using methods of the invention. Both film stacks may represent interconnect applications as described previously. The film stack of FIG. 3A is formed on an underlining substrate 301, which may be a single component or more commonly a complex multi-feature structure having various conductive, insulating, and semiconductor components. For example, substrate 301 may have a top layer comprising silicon or a dielectric such as silicon dioxide. Contacting substrate 301 is, in the following order, a titanium layer 303, a titanium nitride layer 305, a tungsten nucleation layer 307 (formed in accordance with this invention) and a tungsten bulk layer 309. Titanium layer 303 is typically deposited by a CVD process which provides reasonably good adhesion to the underlying substrate 301. Titanium nitride layer 305 is typically deposited using CVD or PVD methods and is used to protect the underlying titanium and/or silicon from exposure to tungsten hexafluoride ($WF_6$) during subsequent tungsten deposition. It has been found that $WF_6$ reacts very aggressively and sometimes explosively with titanium. Tungsten nucleation layer 307 and tungsten bulk layer 309 are formed in accordance with the methods of the present invention as described above. In interconnect applications as described above, layers 303, 305, 307 and 309 are all etched to form interconnect lines.

The film stack of FIG. 3B is similar to that of FIG. 3A in that there is an underlining substrate 311 (comprising, for example, silicon and/or silicon dioxide), a tungsten nucleation layer 315 and a tungsten bulk layer 317. However, instead of titanium and titanium nitride layers, a tungsten layer 312 and a tungsten nitride layer 313 are employed. The nitride layer 313 is used to protect the underlying silicon from exposure to $WF_6$ and is typically deposited using a CVD or PVD process which provides reasonably good adhesion to the underlying silicon or dielectric substrate, but does not necessarily provide a sufficiently high quality layer to serve as an interconnect. As in the film stack of FIG. 3A, all the layers 612, 613, 615 and 617 are etched to form interconnect lines.

Other Embodiments

While this invention has been described in terms of several embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention.

What is claimed is:

1. A method of forming a tungsten layer on a partially fabricated semiconductor substrate comprising: depositing a tungsten (W) nucleation layer on the semiconductor substrate by a combined PNL-CVD nucleation layer process, said combined PNL-CVD nucleation layer process comprising sequentially exposing the substrate to a reducing agent and a tungsten-containing precursor in one or more PNL cycles and, after the one or more PNL cycles, depositing at least a portion of a tungsten (W) nucleation layer by a chemical vapor deposition (CVD) process; wherein the CVD portion of the combined PNL-CVD nucleation layer process uses silane and hydrogen as reducing agents, wherein the PNL portion of the combined PNL-CVD nucleation layer process is performed at a substrate temperature of less than about 350 C and the CVD portion of the PNL-CVD nucleation layer process is performed at a substrate temperature of at least about 400 C; and depositing a tungsten (W) bulk layer on the tungsten (W) nucleation layer using a CVD process, wherein the CVD bulk deposition uses hydrogen as a reducing agent; wherein the tungsten (W) nucleation layer facilitates the formation of the tungsten (W) bulk layer.

2. The method of claim 1 wherein depositing the nucleation layer on the substrate comprises no more than two PNL cycles.

3. The method of claim 1 wherein the PNL portion of the combined PNL-CVD nucleation layer process deposits between about 0 and 1 Angstroms of tungsten on the substrate surface.

4. The method of claim 1, further comprising, prior to depositing the nucleation layer, performing an initiation soak step.

5. The method of claim 1, wherein the nucleation layer is between about 30-100 Angstroms thick.

6. The method of claim 1, wherein the nucleation layer is no more than about 20 Angstroms thick.

7. The method of claim 1, wherein the combined PNL-CVD nucleation layer process does not use a borane as a reducing agent.

8. The method of claim 1, wherein transitioning between nucleation layer and bulk deposition comprising stopping a flow of silane and maintaining a tungsten-containing precursor flow.

9. The method of claim 1, wherein both of the PNL and CVD portions of the combined PNL-CVD nucleation layer process use a silane reducing agent.

10. The method of claim 1, wherein the combined PNL-CVD nucleation layer process further comprises a reducing agent soak step between the PNL and CVD portions of the process.

11. A method of forming a tungsten film on a substrate in a reaction chamber, the method comprising:
(a) positioning the substrate in a reaction chamber;
(b) exposing the substrate to a silane;
(c) exposing the substrate to a tungsten-containing precursor;
(d) repeating operations (b) and (c) to deposit at least a portion of a tungsten
(W) nucleation layer, wherein operations (b)-(d) occur at a temperature of about 350 C or less;
(e) after (d), heating the substrate to a temperature of at least about 400 C;
(f) after heating the substrate, exposing the substrate to a process gas comprising a silane and a tungsten-containing precursor to deposit at least a portion of the tungsten (W) nucleation layer; and
(g) exposing the substrate to a process gas comprising hydrogen and a tungsten-containing precursor to deposit a bulk tungsten layer (W) on the tungsten nucleation layer to form the tungsten film, wherein the tungsten (W) nucleation layer facilitates the formation of the bulk tungsten (W) layer.

12. The method of claim 11, wherein between 0-5 Angstroms of tungsten are deposited prior to operation (f).

13. The method of claim 11, wherein operation (f) comprises depositing the portion of a nucleation layer by a silane reduction process and operation (g) comprises depositing the bulk tungsten layer by a hydrogen reduction process.

14. The method of claim 11, wherein (e) further comprises exposing the substrate to a silane soak.

* * * * *